July 20, 1965 D. C. DICKSON, JR 3,196,327

P-I-N SEMICONDUCTOR WITH IMPROVED BREAKDOWN VOLTAGE

Filed Sept. 19, 1961

INVENTOR.
DONALD C. DICKSON, JR
BY John J. McLaughlin
ATTORNEY 3,196,327

P-I-N SEMICONDUCTOR WITH IMPROVED BREAKDOWN VOLTAGE

Donald C. Dickson, Jr., 4932 E. Calle del Norte, Phoenix, Ariz.

Filed Sept. 19, 1961, Ser. No. 139,110
4 Claims. (Cl. 317—234)

My invention relates to an improved P-I-N type semiconductor device and method of producing the same. It relates more in particular to a semiconductor device of the character described with improved voltage distribution across the P-I-N junction with resulting increase in breakdown voltage.

Semiconductor devices, such as rectifiers, are normally required to have a relatively high breakdown voltage. Relatively low leakage current is also a desirable feature, although normally not so important as high breakdown voltage, because the latter establishes a direct limitation on the voltage with which the device may be used. In theory, silicon rectifiers can be produced having relatively high breakdown voltage, say of the order of 2000 volts or higher, but in practice it is difficult to produce commercial semiconductor devices, such as rectifiers, whose actual performance closely approaches the theoretical.

The principal object of the present invention is to produce an improved semiconductor device of the P-I-N type.

Another object is to produce such a semiconductor device having relatively high breakdown voltage.

P-N-N+ junctions are popularly referred to in the art as P-I-N junctions; the name, or "misnomer" may be attributed to two factors. First, the N region of a P-N-N+ junction may be of such high resistivity as to approach intrinsic or "I" material; second, as is frequently the case, those skilled in the art attach conveniently-pronounced names to elements with which they frequently deal. Hence, P-N-N+ elements are popularly known as "pin semiconductor devices." The following description refers to P-I-N junctions in the popular sense, it being understood that such junctions are actually successive layers of P, N, and N+ semiconductor material.

Still another object is to produce a semiconductor device of the P-I-N type in which the actual breakdown voltage approaches the theoretical for the particular type and structure of device produced.

A further object is to improve the voltage distribution across a P-I-N junction.

A still further object is to improve the voltage distribution across a P-I-N junction, and thus to increase the breakdown voltage across such junction.

Other specific objects and features of the invention will be apparent from the following detailed description taken with the accompanying drawings, wherein.

I have found that the non-uniform distribution of the field across the P-I-N junction referred to hereinabove and explained more fully hereinbelow can be corrected to a remarkable extend by forcing the voltage to divide evenly across the "I" region by forming a very thin, relatively low resistivity ring or cylinder of uniform cross section at the exposed junction edge of the semiconductor element. This cylinder must be precisely controlled as to material and thickness, and while it should have somewhat lower resistivity than the doped semiconductor material comprising the "I" region, it should not introduce such a leakage path as to deleteriously affect the normal functioning of the device. There is, of course, considerable latitude in the selection of the material comprising the cylinder, but its thickness must be appropriately controlled as will be explained.

Figure 1:
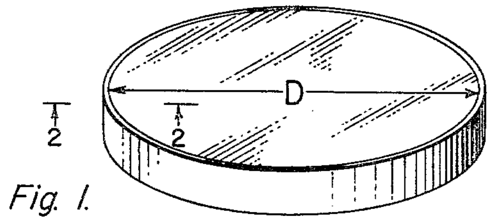
FIG. 1 is a greatly enlarged semiconductor element indicating schematically the manner of practising the present invention.
Figure 2:
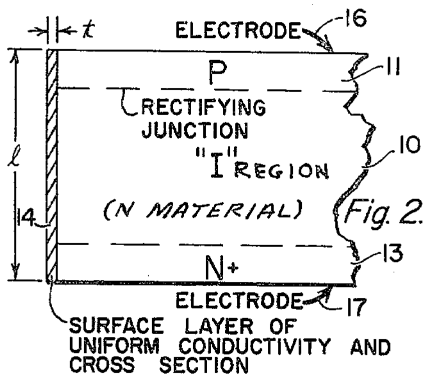
FIG. 2 is a further enlarged fragmentary sectional view taken on the line 2—2 of FIG. 1.

Referring now first briefly to FIGS. 1 and 2, the "I" region may be N-type silicon doped to 100 to 1000 ohms-cm. resistivity, for example. The P layer 11 may be formed by diffusing boron at one side, and the N+ layer 13 formed by diffusing phosphorus into the opposite side. Illustratively the total diameter of the wafer comprising FIG. 1 may be 0.22 cm., and the thickness .025 cm. While these figures are all illustrative, they are typical of this form of device.

A thin-walled cylinder 14 extends entirely around the wafer, and its side walls must be uniform for dependable results. This cylinder, which will be discussed more in detail hereinbelow, may be formed in any suitable manner and may be only a mono-molecular layer thick, or may even be somewhat discontinuous but uniformly distributed, depending upon the material used and in part on the manner of its application.

The semiconductor device of the present invention has the usual contacting electrodes shown schematically at 16 and 17 in FIG. 2. These electrodes may be of any usual type and applied in any usual manner. Their function is exactly the same in the present invention as in the devices of the prior art.

Before discussing further the current shunting and field levelling cylinder at the edges of the die or wafer comprising the semiconductor element, it is advisable that further consideration be given to a comparable semiconductor device of the prior art in which the breakdown voltage is found to be substantially less than theoretically obtainable.

Figure 4:
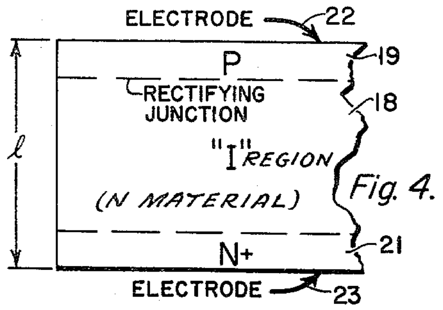
FIG. 4 is a view similar to FIG. 2 but indicating the classical P-I-N semiconductor device of the prior art.

FIG. 4 indicates a semiconductor element with the "I" region 18, P layer 19 and N+ layer 21. It may have electrodes 22 and 23 of any usual type. Assuming that the starting wafer is high resistivity N-type material (100 to 1000 ohms/cm., for example) and the P and N layers formed by diffusing boron and phosphorus respectively into the top and bottom surfaces, the semiconductor device of FIG. 4 may be considered as being identical with the FIG. 2 device except for the edge cylinder 14 forming a part of the latter. Let us look at the characteristics of the postulated FIG. 4 device as described.

Figure 5:
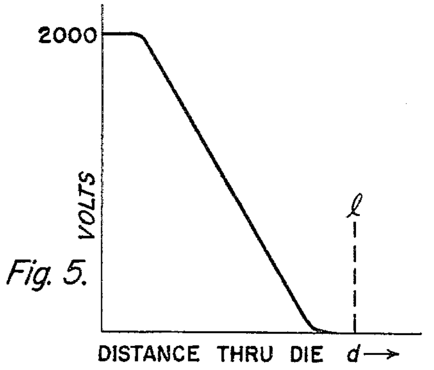
FIG. 5 is a graph showing the classical or theoretical or ideal voltage distribution through a wafer comprising a P-I-N junction.
Figure 6:
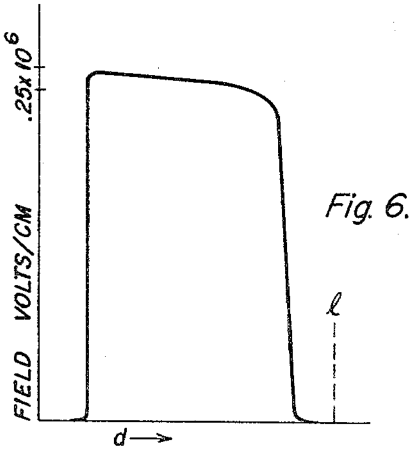
FIG. 6 is a graph showing the theoretical field distribution just short of actual breakdown.

If we assume a classically or theoretically perfect structure for the FIG. 4 device, and assume such device is reverse biassed to 2000 volts, or just short of its breakdown voltage for this particular wafer, then we can show the voltage distribution through the wafer by FIG. 5 and the field distribution by FIG. 6. For convenience of illustration the graphs of FIGS. 5 and 6 (as well as FIG. 7, to be referred to later) are shown in the first quadrant, even though reverse bias might indicate that this should be shown in the third quadrant.

Field distribution is of paramount importance in determining the maximum reverse bias voltage which can be sustained across the wafer comprising FIG. 4. Electrical breakdown of silicon is known to occur at an essentially fixed value of field, which is of the order of 250,000 volts/cm. Electrical breakdown occurs in a P-I-N structure when the field at any point within the "I" region exceeds approximately 250,000 volts/cm. Theoretically, and possibly actually, the maximum field strength occurs at the rectifying junction. As FIG. 6 indicates, however, the field throughout the "I" region is only slightly less than at the rectifying junction itself.

Figure 7:
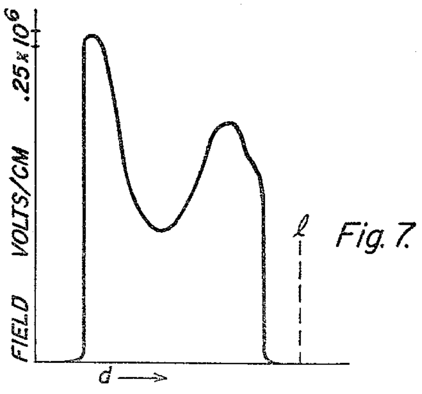
FIG. 7 is a graph indicating approximately the actual field distribution just short of breakdown.

It is important to keep in mind that the total voltage across a P-I-N wafer or die as shown in FIG. 4 is equal to the integral of the field versus thickness curve. For a given thickness of die, and assuming a maximum possible field, limited to something like 250,000 volts/cm., for example, breakdown voltage can be maximized by making the field as nearly constant as possible throughout the "I" region. It is also important that the thickness of the "I" region portion of the wafer be as uniformly great as the distance between the rectifying junction and the "I"-N+ junction. In actual semiconductor devices such as rectifiers, the ideal field distribution shown in FIG. 6 is almost never realized. There are several factors tending to distort the field and lower breakdown voltage, important among which are geometric disturbances, dielectric disturbances, and conductive particles. In actual practice, therefore, the field distribution is usually quite different than shown in FIG. 6. While the actual field distribution-thickness curve may take various forms, FIG. 7 may be taken as illustrative of the kind of departure from the classical or theoretical which might be found. The graph of FIG. 7, in other words, shows what the field distribution across an actual die or wafer might look like just short of breakdown. It will be noted that the field at the rectifying junction is just under the assumed breakdown value of 250,000 volts/cm. as shown in FIG. 6. The area under the curve of FIG. 7 is substantially less than in the case of FIG. 6, however, so that breakdown does not occur at 2000 volts but at a considerably lower voltage, such as 1200 volts, for example. There is a still further disadvantage, however, in that from one presumably identical device to another this actual breakdown voltage may vary, and uniformity of production output presents a problem.

Figure 3:
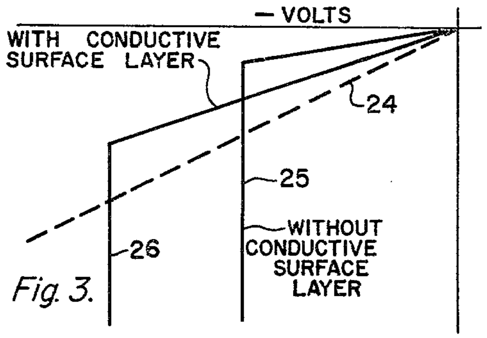
FIG. 3 is a graph indicating respectively the relative breakdown voltage and leakage current of a semiconductor device made according to the present invention and a comparable device made in accordance with prior art practices.

The non-uniform field distribution discussed above, and the resulting drop in the actual breakdown voltage from that theoretically possible can be substantially corrected by the method and techniques of the present invention as illustrated schematically in FIGS. 1 and 2. The lower resistivity "cylinder" at the wafer's edge forces the voltage to divide evenly across the "I" region of the wafer. It is essential that this "cylinder" be thin and of uniform cross-section throughout. When properly processed, the semiconductor device of my present invention may differ in performance from a comparable device not employing my invention in the general manner shown in FIG. 3. In this figure the line 25 identifies the characteristics of the prior art device, and line 26 the device of the present invention. The curves are shown in the third quadrant with voltage on the X axis and current on the Y axis. Values are proportional rather than actual. It will be noted that breakdown, occurring at the "knee" of the lines, is at a higher voltage when the device of the present invention is plotted, although leakage is somewhat greater, a circumstance to be expected, but normally of no great significance in a rectifier, provided the increased leakage remains lower than that maximum permissible leakage in any given application represented by broken line 24 in FIG. 3.

The specific material comprising the relatively lower resistivity shunting cylinder at the edge of the semiconductor element may vary over a considerable range. The thickness and some other characteristics are functions of the material selected and in part of the manner of its application. The conductive layer comprising the "cylinder" 14 (FIG. 2) in general is generated after the semiconductor element has otherwise been completed. Assuming completion of the P-I-N wafer or die, the conductive surface layer can be applied by evaporation onto the edge of the wafer or die in a vacuum, by epitaxial deposition of a thin layer of conductive material to the edge of the die, and in still other ways. One important requirement is that the thickness be controlled accurately for the material being used—and in part for the method used—and that the deposition be as uniform as possible. In order that those skilled in the art may understand the manner of first determining the required thickness of the deposition comprising the "cylinder" 14, the following calculation may be noted.

The symbols $l$, $t$ and D are shown in FIGS. 1 and 2. The total resistance of the "cylinder" 14 is a function of its area and length. The area of $t$ is readily determined by first figuring the area of the entire die and then substituting the area of D, the part within the "cylinder" 14. We find this area to be $$A \cong \frac{\pi}{4}(4Dt-4t^2)$$

But since $t$ is fractional, $t^2$ becomes insignificant and we get the value $$A \cong \frac{\pi}{4}(4Dt)=\pi Dt$$

for the area of $t$.

We know that $$R=\rho\frac{l}{A} \text{ or } A=\rho\frac{l}{R}$$

where R is the total end-to-end resistance of the "cylinder" and $\rho$ is the resistivity of the "cylinder" 14 in ohm/cm. If we assume that $\rho$ is one ohm/cm.; $l$ is 0.025 cm.; D is 0.22 cm.; and R is 1 megohm ($10^6$ ohms), then we can combine the above equations giving:

$$\pi Dt=\rho\frac{l}{R} \text{ or } t=\frac{\rho l}{\pi DR}$$

Substituting $$t=\frac{1\times.025 \text{ cm.}}{\pi\times.22 \text{ cm.}\times10^6}=0.0361\times10^{-6} \text{ cm.} = 3.52 \text{ Å}$$

Thus it may be seen that, depending on the material used, the "thickness" of the cylinder 14 may be as little as one atomic layer or effectively less.

In actual practice, a relatively large number of wafers or dies may be stacked up so that only their edges are exposed. So stacked, they may be placed in a chamber, the air evacuated from the chamber, and selected conductive material evaporated within the evacuated chamber and a film of such material thus caused to deposit uniformly on the exposed edges of the wafers. Suitable materials which may be applied in this manner are platinum, gold, carbon, stainless steel, chromium and the like. In order to work with a "cylinder" thickness of one or more atomic layers it is preferred to use materials in the resistivity range of approximately 0.1 to 10 ohm/cm. for structures comparable in physical size to that used as an example hereinabove. In general, metals which oxidize readily are not recommended, although aluminum may be employed by first forming a thicker film than required and then subjecting the film to accelerated oxidation.

Methods for vaporizing metals in a vacuum are known and I may employ any usual method for my purpose. Control and determination of the thickness of the deposited film may be accomplished in various ways such, for example, as by determining the shunt leakage along the conducting "cylinder" 14 and by determining the breakdown voltage.

Epitaxial deposition of a thin conductive layer on the edge of the die is another available way of obtaining the desired conductive cylinder. Since the resistivity of an epitaxial layer may be $10^6$ times or more higher than films of platinum and the like metals evaporated onto the edge, the epitaxial thickness can be much greater for the same pre-determined shunt conductivity.

It is quite interesting to note that the desired conductive layer may be part of the silicon itself. If a PIN die with a clean, etched edge is sandblasted uniformly, the surface damage can produce a low resistivity layer which may well force a uniform voltage distribution. The sandblasting should be done with very fine particles in order not to have excessive conduction in the surface layer.

As especially interesting method of creating the desired conductive layer is to mechanically grind and polish the edge of the die until the surface damage remaining contributes the desired magnitude of leakage conductivity.

The invention has been described by specific reference to the use of silicon semiconductor material, but semiconductor devices employing other types of semiconductors may embody the present invention to advantage.

I have described my invention in detail so that those skilled in the art may understand the manner of practising the same, but the scope of the invention is defined by the claims.

I claim:

1. An improved semiconductor device having P, N, and N+ layers; a uniform, voltage field-forcing cylinder in contact with and encircling said device in electrical shut with a PN junction formed by said P and N layers; said cylinder comprising material having a lower resistivity than said N layer and said cylinder having means for increasing the leakage current and for increasing the breakdown voltage of the PN junction.

2. An improved semiconductor device comprising a wafer of high resistivity N-type silicon, a diffused layer of P-type silicon on one face and a diffused layer of N+-type silicon on the opposite face forming a PNN+ junction; a uniform, voltage field-forcing cylinder in contact with and encircling said device in electrical shunt with a PN junction formed by said P and N layers; said cylinder comprising material having a lower resistivity than said N layer and said cylinder having means for increasing the leakage current and for increasing the breakdown voltage of the PN junction.

3. An improved semiconductor device as defined in claim 2 wherein said cylinder comprises an abraded surface on said silicon wafer.

4. An improved semi-conductor device as defined in claim 1 wherein said cylinder comprises an abraded surface on said semiconductor device.

References Cited by the Examiner

UNITED STATES PATENTS

| | | | |
|---|---|---|---|
| 2,789,258 | 4/57 | Smith | 317—235 |
| 2,983,854 | 5/61 | Pearson | 317—235 |
| 3,129,119 | 4/64 | Rouse et al. | 148—1.5 |
| 3,150,013 | 9/64 | Stanton | 148—1.5 |

JOHN W. HUCKERT, *Primary Examiner*.

JAMES D. KALLAM, DAVID J. GALVIN, *Examiners*.